(12) United States Patent
Shelton et al.

(10) Patent No.: US 8,391,068 B2
(45) Date of Patent: Mar. 5, 2013

(54) ADAPTIVE PROGRAMMING FOR FLASH MEMORIES

(75) Inventors: Douglas Edward Shelton, Wylie, TX (US); John Howard MacPeak, Garland, TX (US); Eddie Hearl Breashears, Lucas, TX (US); Bruce Lynn Pickelsimer, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 164 days.

(21) Appl. No.: 12/973,250

(22) Filed: Dec. 20, 2010

(65) Prior Publication Data

US 2012/0155187 A1 Jun. 21, 2012

(51) Int. Cl.
*G11C 11/34* (2006.01)

(52) U.S. Cl. ......... 365/185.18; 365/185.33; 365/185.19; 365/185.24; 365/185.29

(58) Field of Classification Search .............. 365/185.18, 365/185.33, 185.19, 185.24, 185.29
See application file for complete search history.

(56) References Cited

U.S. PATENT DOCUMENTS

| | | | | |
|---|---|---|---|---|
| 5,926,409 A | * | 7/1999 | Engh et al. | 365/45 |
| 6,052,306 A | * | 4/2000 | Sedlak et al. | 365/185.19 |
| 6,278,632 B1 | * | 8/2001 | Chevallier | 365/185.03 |
| 6,781,882 B2 | * | 8/2004 | Shimizu et al. | 365/185.19 |
| 7,009,881 B2 | * | 3/2006 | Noguchi | 365/185.17 |
| 7,057,937 B1 | * | 6/2006 | Matsubara et al. | 365/185.24 |
| 7,349,263 B2 | * | 3/2008 | Kim et al. | 365/185.19 |
| 7,468,908 B2 | * | 12/2008 | Tanaka | 365/185.03 |
| 7,656,710 B1 | * | 2/2010 | Wong | 365/185.19 |
| 7,839,690 B2 | * | 11/2010 | Lee et al. | 365/185.18 |
| 8,036,044 B2 | * | 10/2011 | Dong et al. | 365/185.29 |
| 8,223,551 B2 | * | 7/2012 | Sarin et al. | 365/185.19 |
| 8,243,520 B2 | * | 8/2012 | Chan et al. | 365/185.19 |
| 2012/0014179 A1 | * | 1/2012 | Choy et al. | 365/185.3 |
| 2012/0096234 A1 | * | 4/2012 | Jiang et al. | 711/170 |

* cited by examiner

*Primary Examiner* — Viet Q Nguyen

(74) *Attorney, Agent, or Firm* — Rose Alyssa Keagy; Wade J. Brady, III; Frederick J. Telecky, Jr.

(57) ABSTRACT

A method to adjust the programming voltage in flash memory when the programming time exceeds specification. A method to adjust the programming voltage of flash memory after a predetermined number of erase/write cycles.

19 Claims, 11 Drawing Sheets

ADAPTIVE PROGRAMMING FOR FLASH MEMORIES

BACKGROUND

This invention relates to the field of integrated circuits. More particularly, this invention relates to erasing and writing to flash memories.

DETAILED DESCRIPTION

Figure 1:
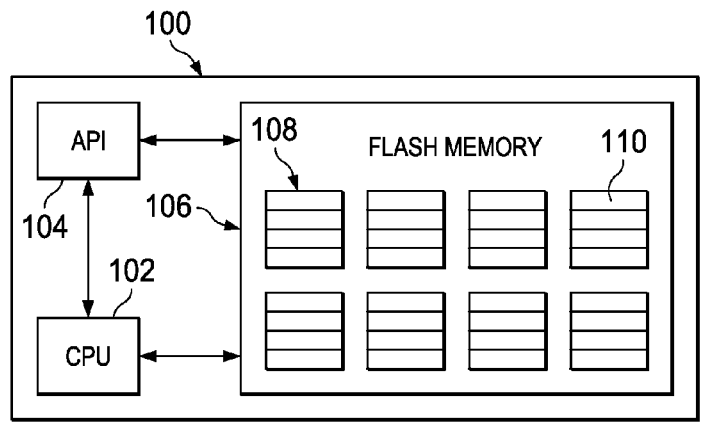
FIG. 1 is a diagram of a flash integrated circuit.

The example embodiments are described with reference to the attached figures, wherein like reference numerals are used throughout the figures to designate similar or equivalent elements. The figures are not drawn to scale and they are provided merely to illustrate the example embodiments. Several aspects are described below with reference to example applications for illustration. It should be understood that numerous specific details, relationships, and methods are set forth to provide a full understanding of the example embodiments. One skilled in the relevant art, however, will readily recognize that the example embodiments can be practiced without one or more of the specific details or with other methods. In other instances, well-known structures or operations are not shown in detail to avoid obscuring the embodiment. The example embodiments are not limited by the illustrated ordering of acts or events, as some acts may occur in different orders and/or concurrently with other acts or events. Furthermore, not all illustrated acts or events are required to implement a methodology in accordance with the example embodiments.

The term "verify" refers to the process of reading a flash bit to determine if a write or erase has been successful.

The term "adaptive programming voltage" is an adaptive erase voltage or an adaptive write voltage that may be selected in order to erase or write a portion of a flash memory within a specified time period. The adaptive programming voltage may be applied to the control gate or may be applied to an electrically isolated well (flash well) under the flash bit. Adaptive erase voltages or adaptive write voltages may be simultaneously applied to the control gate and the flash well to erase or write the flash bit within a specified time.

The term "programming" refers to the operation of writing data to the floating gate or erasing data from the floating gate. During a programming operation, electrons may be trapped on the floating gate or may be removed from the floating gate.

A flash integrated circuit 100 containing a flash memory 106 is shown in FIG. 1. Also included in the integrated circuit are a central processor unit ("CPU") 102 and an Application Programmer Interface ("API") 104. The integrated circuit may also contain other circuits such as a Static Random Access ("SRAM") memory, a phase locked loop, and analog circuitry (that are not shown to simplify the drawing).

The API 104 contains the software program that controls the flash read, write, and erase functions. When the CPU 102 wants to access the flash memory 106 it may send a request containing the targeted data address to the API 104. The API 104 then sends the proper signals to the bitlines, wordlines, and sense amps in the flash memory 106 to perform the requested memory access operation. For example, when the CPU 102 wants to write data into flash memory 106, it sends this request to the API 104. The API 1004 then sends the proper signals to the specified memory block 108 to erase the block and then rewrite the new data into the memory block 108. The memory blocks 108 typically contain 1 to 8 megabit ("M") flash bits. Memory sectors 110 within the memory block 108 typically contain 64K to 1M flash bits. During a data write, the full flash memory 106 may be erased and rewritten, a memory block 108 may be erased and rewritten, or a memory sector 110 may be erased and rewritten—depending upon the flash architecture. In the example below a block erase and write will be used to illustrate the embodiment.

Figures 2A, 2B:
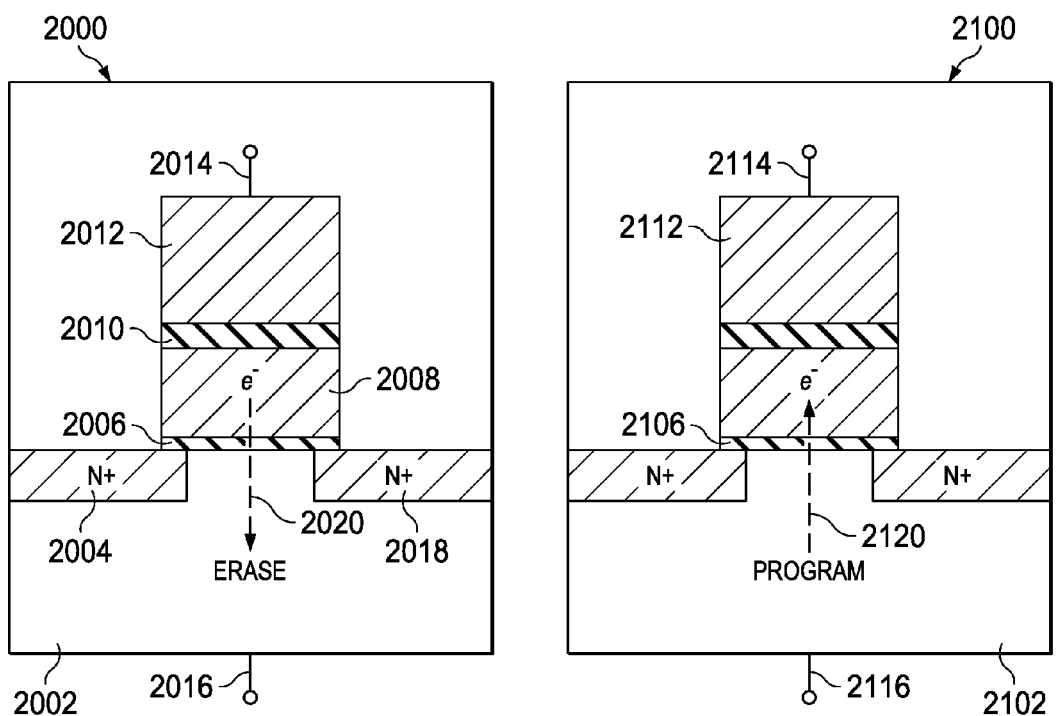
FIGS. 2A and 2B are cross-sections of an NMOS flash bit during an erase and a write operation.

FIG. 2A shows an example of an NMOS flash bit 2000 during an erase using Fowler-Nordheim ("FN") tunneling. The NMOS flash bit is fabricated in an isolated pwell 2002 and it includes a gate dielectric 2006 (usually composed of oxide), a floating gate 2008 (usually composed of polysilicon), an interpoly dielectric 2010 (usually composed of oxide/nitride/oxide layers), a control gate 2012 (usually composed of poly silicon but may also be FUSI or a metal gate), and an N+ source and drain, 2004 and 2016. During erase, a negative voltage 2014 is applied to the control gate 2012 and a positive voltage 2016 is applied to the isolated pwell 2002. This causes electrons 2020 to tunnel through the gate dielectric 2006 from the floating gate 2008 to the isolated pwell substrate 2002. A control gate voltage 2014 of about −8.5V and an isolated pwell voltage 2016 of about +8.5V is used in the example embodiment for illustrative purposes. Actual voltages may differ somewhat depending upon structural details of the flash bit 2000. In addition, the source and drain, 2004 and 2016, are floated in the example embodiment. Although this NMOS flash bit is shown to be in an isolated p-well, the flash bit may be alternatively constructed in a p-substrate (without an isolated pwell). With this alternative structure, the control gate voltage 2014 may be raised to −14 volts or more and the substrate voltage may be ground.

FIG. 2B shows an example of a NMOS flash bit 2100 during a write using FN tunneling. During write, a positive voltage 2114 is applied to the control gate 2112 and the isolated pwell 2102 is grounded 2116. This causes electrons to tunnel 2120 through the gate dielectric 2106 from the isolated pwell substrate 2102 to the floating gate 2108. A control gate voltage 2114 of about 17V and an isolated pwell voltage 2116 of 0V are used in the example embodiment for illustrative purposes. Actual voltages may differ somewhat from these levels, depending upon the structural details of the NMOS flash bit 2100.

Figure 3:
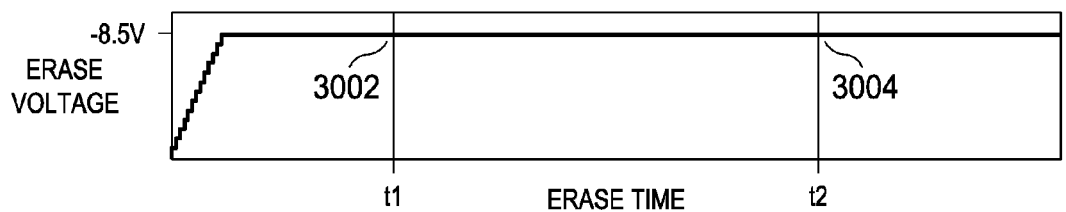
FIG. 3 (Prior Art) is a graph of cumulative erase time.

FIG. 3 shows an example plot 3000 of cumulative erase time vs. erase voltage. A series of erase voltage pulses of approximately 10 millisecond duration—each followed by a verify operation—is repeated until all of the flash bits in a flash block pass the specified erased bit turn on voltage ("Vt"). For example, a first erase period extends until time t1 3002 where an erase verify operation is performed. If the flash block fails the erased Vt specification then a second series of erase voltage pulses is applied to the flash block until time t2 3004 where an erase verify is again performed. This procedure is repeated until either the flash block passes the erase Vt specification or a maximum number of allowed erase verify steps are reached.

Figure 4A:
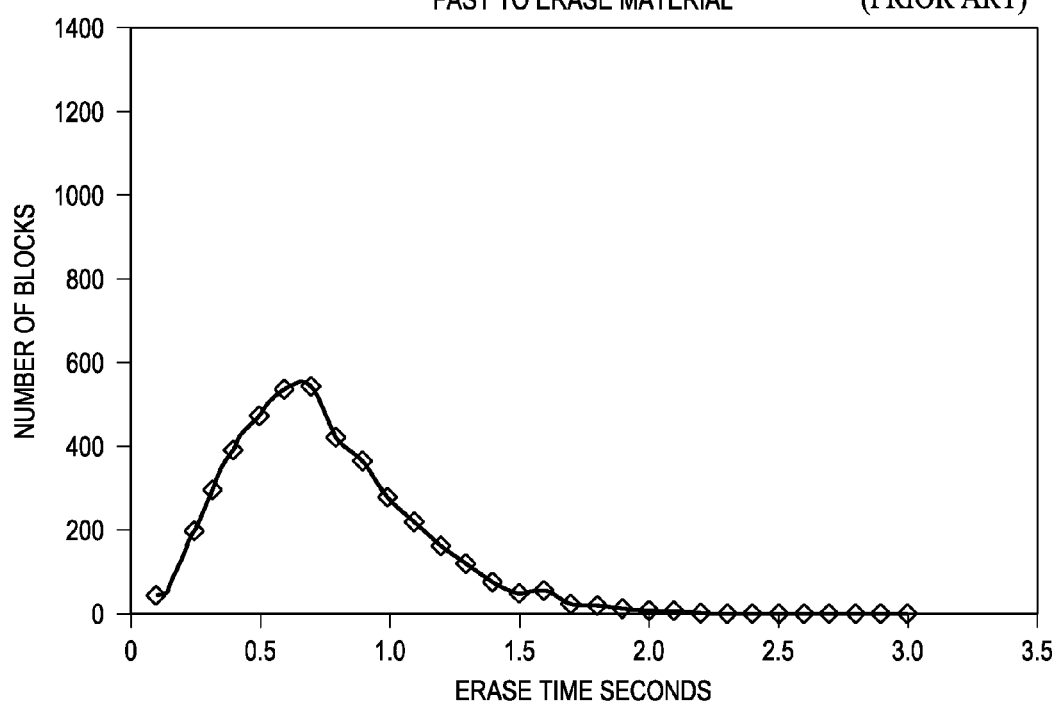
FIGS. 4A and 4B (Prior Art) are graphs of cumulative erase time distributions for flash memory blocks from two different flash integrated circuits.

FIG. 4A shows a plot of the number of blocks that erase by a given erase time versus the cumulative erase time for a flash integrated circuit with fast erase flash bits. The majority of the blocks erase in less than 1 second and virtually all the blocks are erased in less than 2 seconds.

Figure 4B:
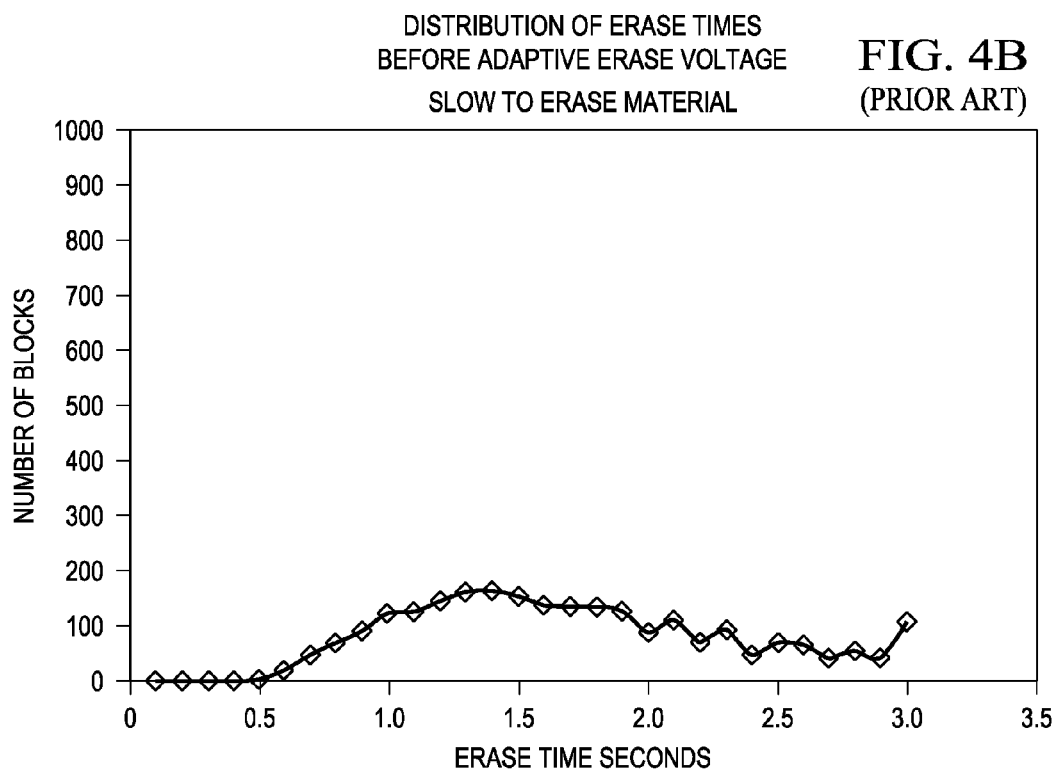

FIG. 4B shows a plot of the number of blocks that erase by a given erase time versus the cumulative erase time for a flash integrated circuit with slower to erase flash bits. The majority of blocks take longer than 1 second to erase. If the erase time specification is less than 3 seconds, any die with chips containing memory blocks that take longer than 3 seconds to erase are scrapped. Flash bits that take a long time to erase may significantly extend the endurance testing time because flash memories may be erased and rewritten over 10,000 times.

Figure 5A:
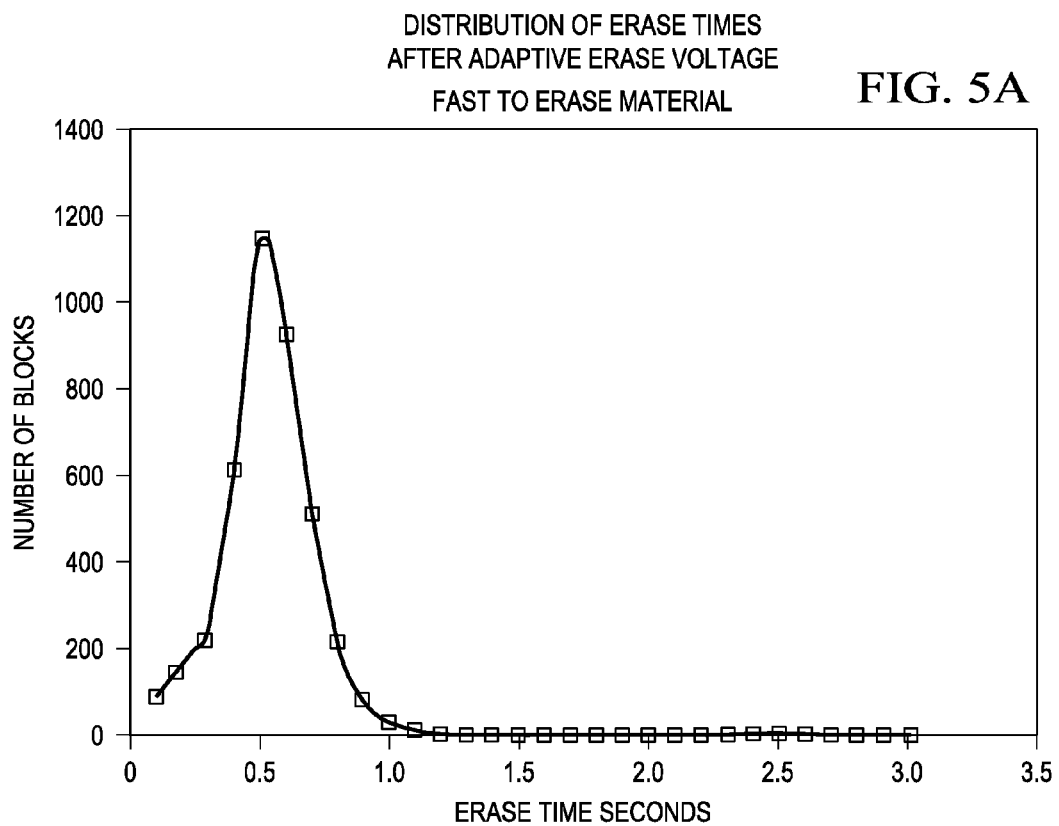
FIGS. 5A and 5B are graphs of the cumulative erase time distributions using an adaptive erase voltage according to an embodiment.
Figure 5B:
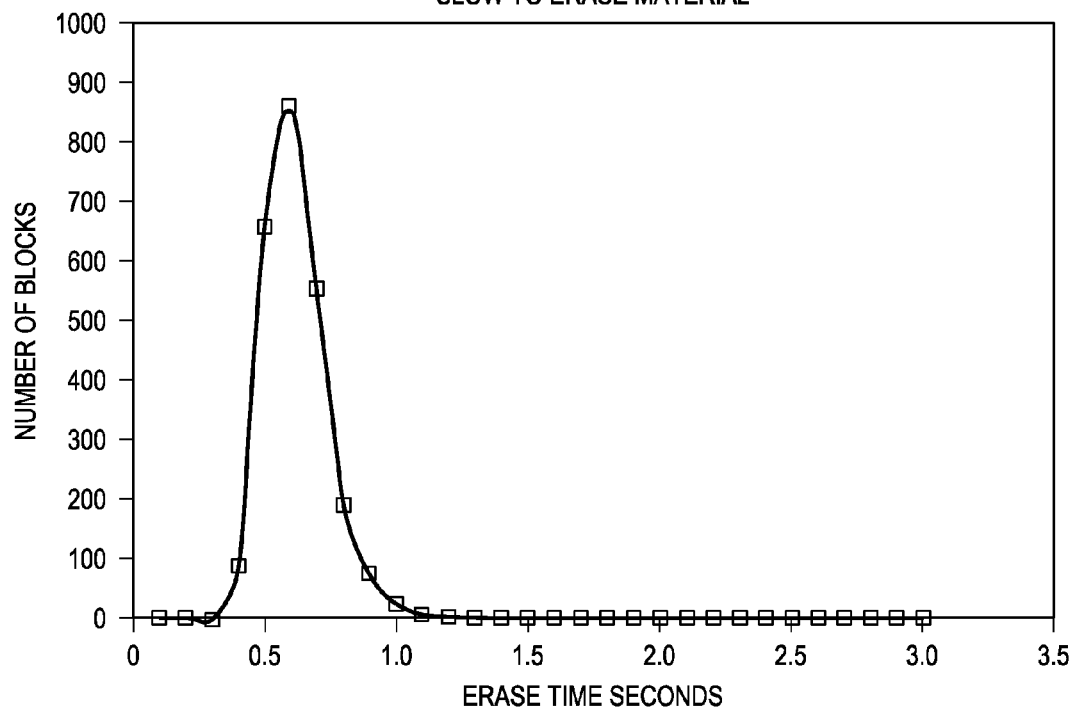

FIGS. 5A and 5B show the block erase times for the memory blocks whose distributions are shown in FIGS. 4A and 4B using the adaptive erase method according to an embodiment infra. The block erase times of both distributions are reduced to approximately less than one second.

NMOS flash bits may be electrically written by hot electron injection and may be electrically erased by hot hole injection or by using ultraviolet light. The following embodiments may be applied to flash bits that are programmed by any of the various means. Moreover, the embodiments infra will be explained using FN erase of a flash memory block but it is understood that the example embodiments are equally applicable to any of the methods of programming (such as hot injection or ultraviolet light) and are equally applicable to programming an individual flash bit, a flash memory array, a flash memory block, or a flash memory segment.

Figure 6A:
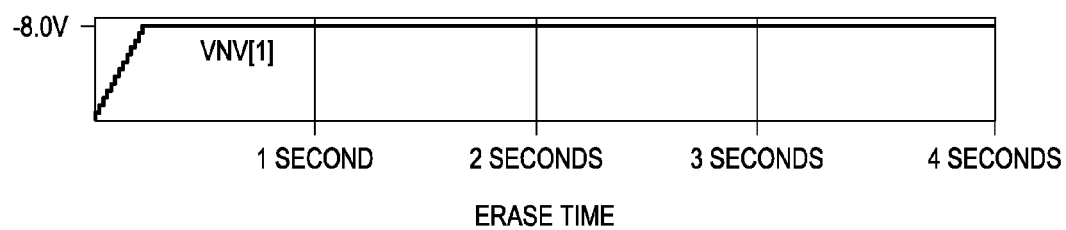
FIGS. 6A, 6B, and 6C illustrate the tightening of an erase time distribution according to an embodiment.
Figure 6B:
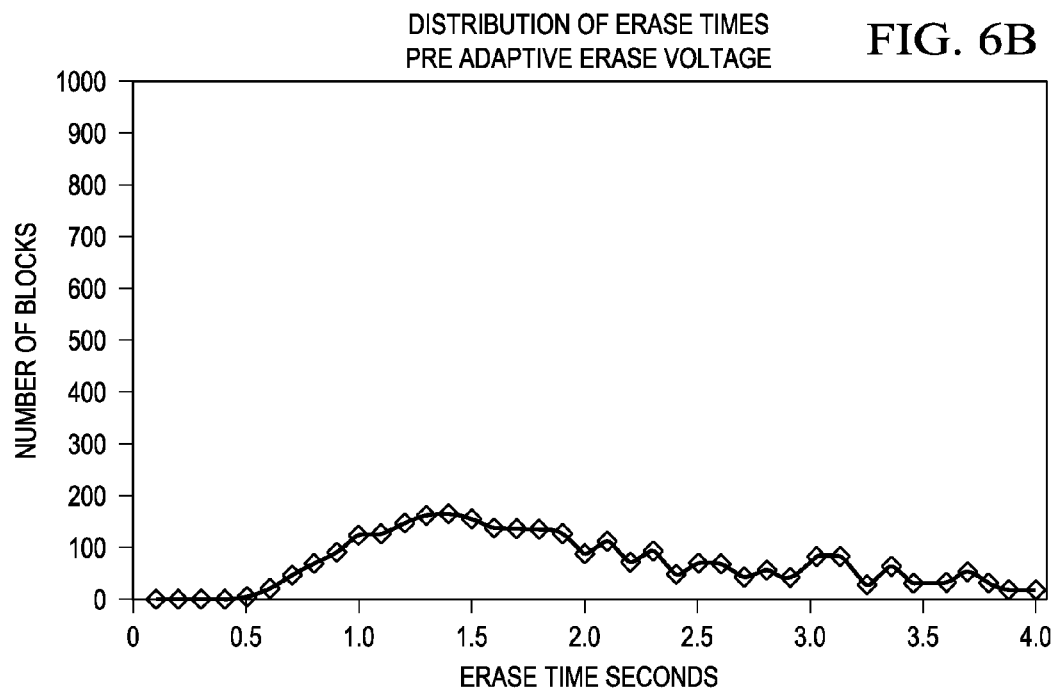
Figure 6C:
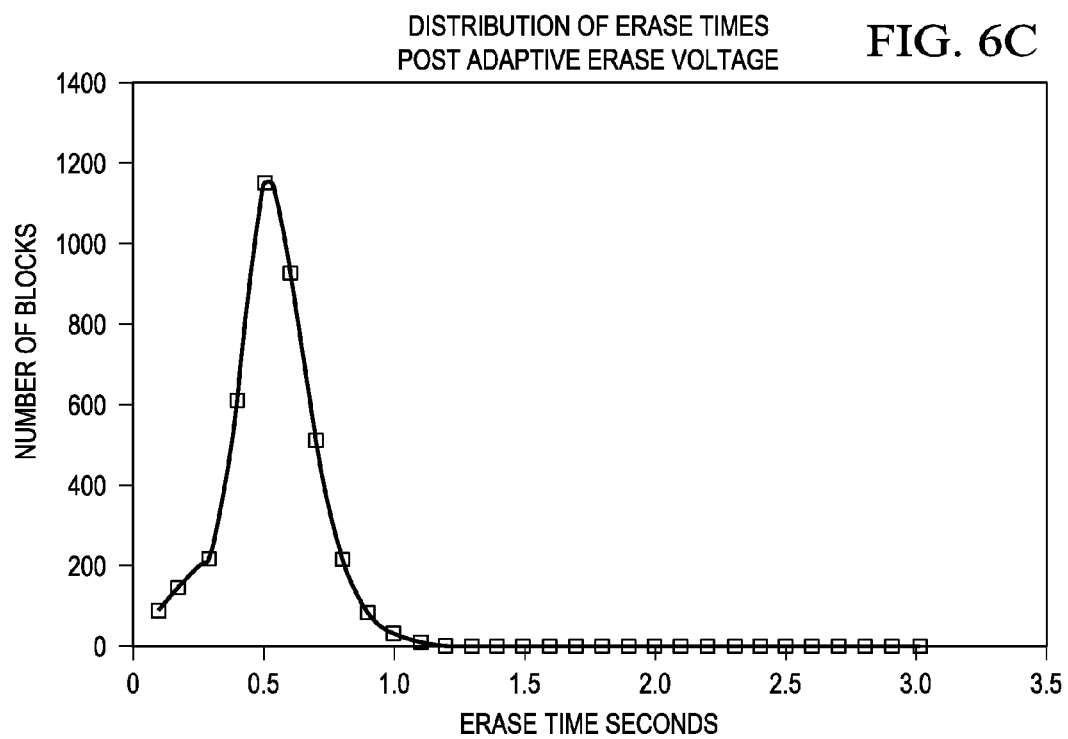

An embodiment adaptive erase method is illustrated in FIGS. 6A-6C. The example voltages in the following description are used for illustrative purposes. Actual voltages may differ depending upon the capacitive coupling and dielectric thicknesses in of the flash bit structures. The control gate erase voltage is used as the adaptive erase voltage for illustrative purposes in this embodiment, but it is understood that the isolated pwell voltage may be used as the adaptive erase voltage. Moreover, a combination of the control gate voltage and the isolated pwell voltage may be used in the adaptive erase method.

The erase voltage versus time, at a constant −8.0 control gate voltage, is shown in FIG. 6A. The distribution of erase times for the flash blocks across a wafer is shown in FIG. 6B. A few memory blocks erase in less than 1 second but most blocks erase between 1 and 2 seconds or longer.

As shown in Table 1, an adaptive erase voltage table may be constructed (for a given technology) between the time it takes for a flash memory block to erase at −8.0 V and the voltage required for that same flash memory block to erase in less than 1 second. In this example, the time to erase a flash memory block at −8.0 V has been divided into 1 second increments. (It is to be noted that different time increments would work equally well. For example, half second increments in the left hand column of Table 1 with correspondingly smaller voltage increments in the right hand column of Table 1 may also be used.) Once this table is constructed for flash blocks for a given technology, it may be used to select the correct adaptive erase voltage for flash blocks on all wafers manufactured with that technology, as long as there is no significant change to the baseline process flow. Therefore, once the erase time has been determined for a flash block, the corresponding adaptive erase voltage may be selected from a table (such as is shown in Table 1). This adaptive erase voltage may then be written into the flash block memory. The API may read this adaptive erase voltage the next time the block is to be erased and use this adaptive erase voltage to erase the memory block. This adaptive erase voltage may also be used in subsequent erases of the memory block.

TABLE 1

| Time in seconds to erase a memory block at −8.0 Volts | Voltage required to erase the memory block in 1 sec or less (Volts) |
| --- | --- |
| 1 | 8 |
| 2 | 8.25 |
| 3 | 8.5 |
| 4 | 8.8 |

FIG. 6C shows the distribution of block erase times when the adaptive erase voltages are used. The distribution is now narrow (compared to the distribution shown in FIG. 6B), with virtually all block times erasing in less than one second. Moreover, blocks with erase times greater than 3 seconds (which previously would have been scrapped due to the failure to meet the maximum programming specification of 3 seconds) may program in less than one second with the adaptive erase voltage and thereby pass specification.

Figure 7A:
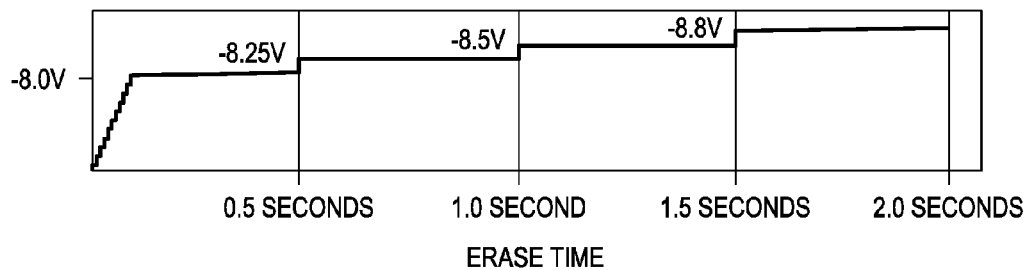
FIGS. 7A and 7B illustrate the tightening of an erase time distribution according to another embodiment.
Figure 7B:
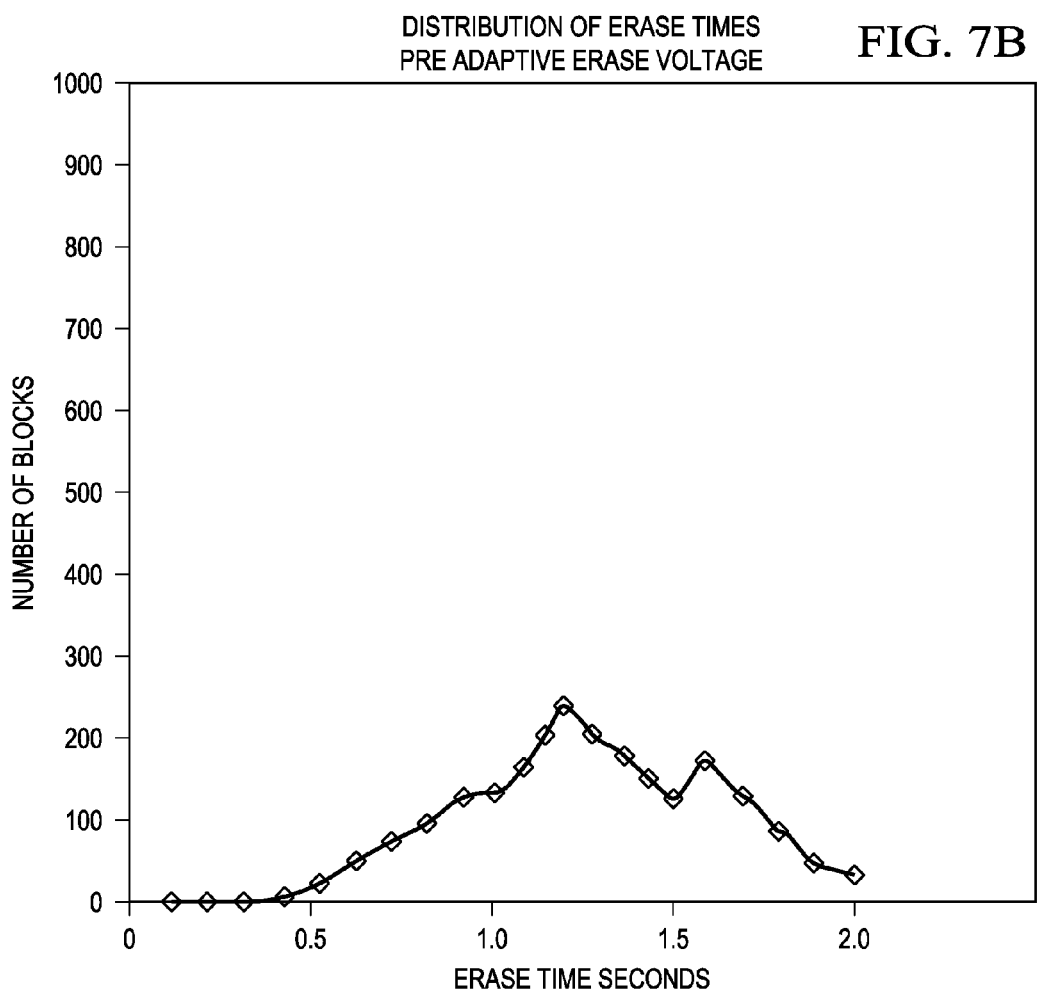

Another embodiment of the adaptive erase voltage method is shown in FIGS. 7A and 7B. As shown in FIG. 7A, the erase voltage may be stepped up after each 0.5 seconds of cumulative erase time. A plot of the number of blocks erased during each time interval is shown in FIG. 7B. In this embodiment, the erase voltage used during each time segment becomes the adaptive erase voltage that is written into each flash memory block that verified erase at that adaptive erase voltage. This adaptive erase voltage may then be used to erase that block during future erases. Four different adaptive erase voltage levels and time segments are used to illustrate this embodiment, but it is understood that a different number of time segments and adaptive erase voltages may be used. While two different methods of determining the adaptive erase voltages are presented supra, it is understood that other methods may be used to determine adaptive erase voltages.

As the number of write and read cycles accumulates on a flash memory block, the time needed to erase and time needed to write to the flash memory may increase. A well know dielectric wear out phenomena is called charge to dielectric breakdown ("QBD"); it is defined as the amount of charge that can flow through a dielectric film before it breaks down. Each time a flash bit writes and erases, a current or charge flows through the gate dielectric. On occasion, this current flow causes a bond to break in the dielectric, thereby forming a defect which may trap an electron. These trapped electrons may accumulate over time, causing the Vt of the transistor to increase and resulting in a longer time to write or to erase that flash bit.

FIGS. 8 and 9A-9C illustrate a method for resetting the adaptive erase voltage throughout the lifetime of a flash circuit. This method may prolong the lifetime of the flash integrated circuit by keeping the flash memory block write and block erase times within specification throughout the targeted lifetime of the flash integrated circuit. The FN erase operation will be used to illustrate this embodiment, but it is understood that the write operation also benefits from this method. The illustrated embodiment uses block erase 108, but it is also understood that it could be a flash memory erase 106 a flash sector erase 110, or an erase of some other portion of the flash memory.

Figure 8:
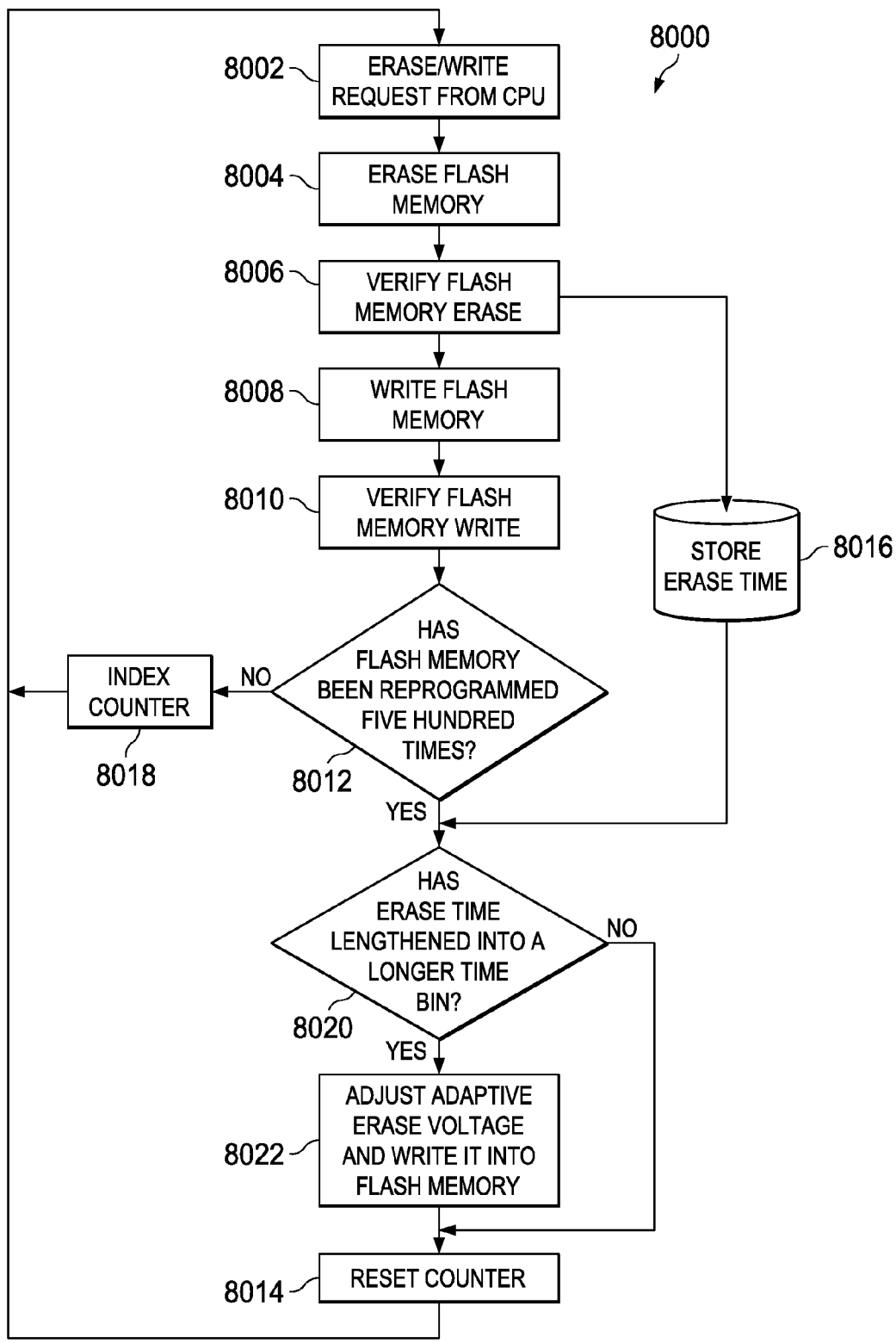
FIG. 8 is a flow diagram describing an embodiment for adaptive programming over the lifetime of a flash circuit.

A flow diagram 8000 of this embodiment is shown in FIG. 8. In the beginning step 8002, the API 104 receives a memory access request from the CPU 102. The API 104 sends the proper signals to the specified memory location 106 to erase and then rewrite new data into the memory block 108 using an initial programming voltage on the control gate. Each time a flash block Goes through an erase 8004/verify 8006 and/or write 8008/verify 8010 cycle, the API program checks 8012 the index counter 8018 to see if that block has then been reprogrammed (erased and rewritten) a predetermined number of times 500 times is used in this example). If not, then the counter 8018 is incremented and the API 104 waits for the next erase/write request 8002 from the CPU 102. If, however, the block has been reprogrammed 500 times, step 8020 checks to see if the erase programming time 8016 has lengthened into one of the longer erase time bins, such as is illustrated in Table 1. If it has lengthened, then a new adaptive erase voltage is selected and written into the flash block memory 8022. This new adaptive erase voltage is then used during subsequent erase/write cycles 8004-8010. In addition, the adaptive erase voltage may be updated after each additional 500 erase/write cycles, if needed. In step 8014, the write/erase cycle counter is reset and the API 104 waits for the next erase/write request 8002 from the CPU 102. In the example embodiment, the application programmer interface (API) 104 contains the program that performs the step sequences shown in FIG. 8. The times, voltages, and number of erase/write cycles used for the method of FIG. 8 are for illustrative purposes only. The actual times, voltages, and number of erase/write cycles may change, depending upon process technology and circuit design details.

Figure 9A:
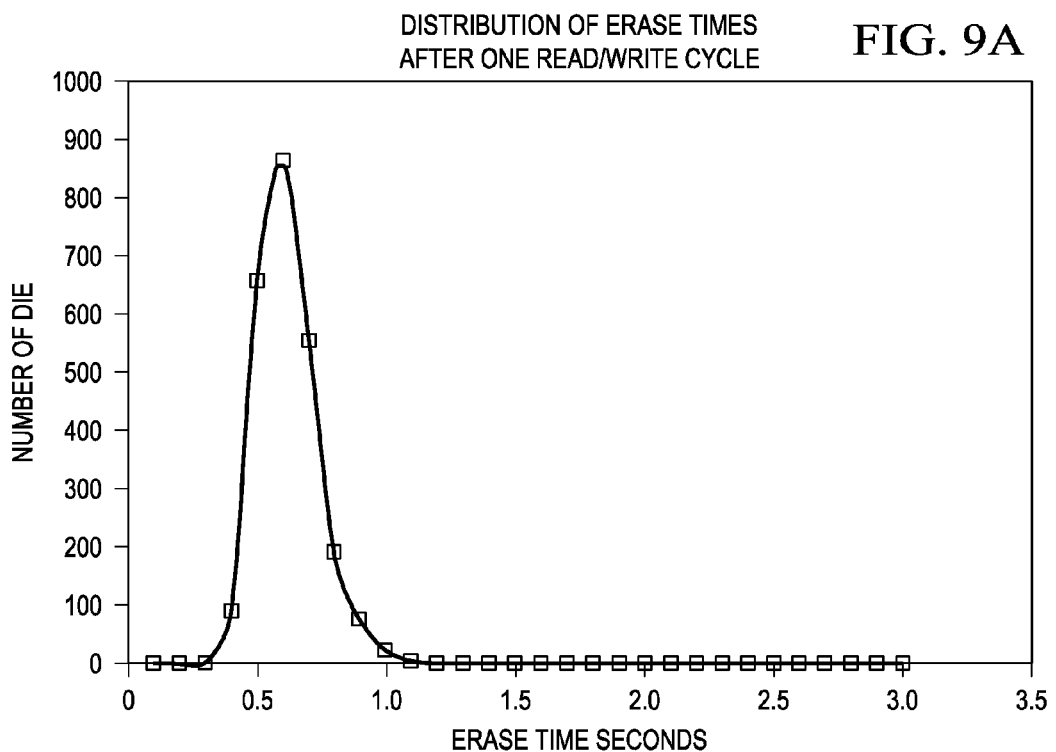
FIGS. 9A, 9B, and 9C are plots of the erase time after various numbers of erase cycles for flash memory according to an embodiment.
Figure 9B:
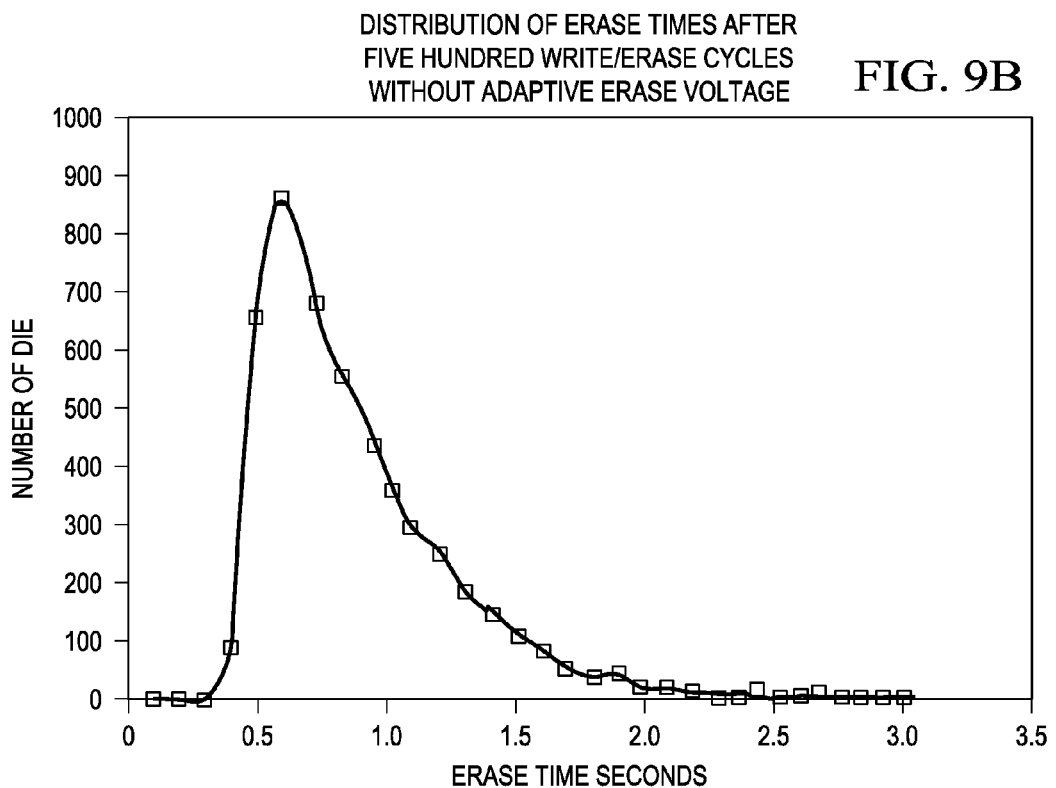
Figure 9C:
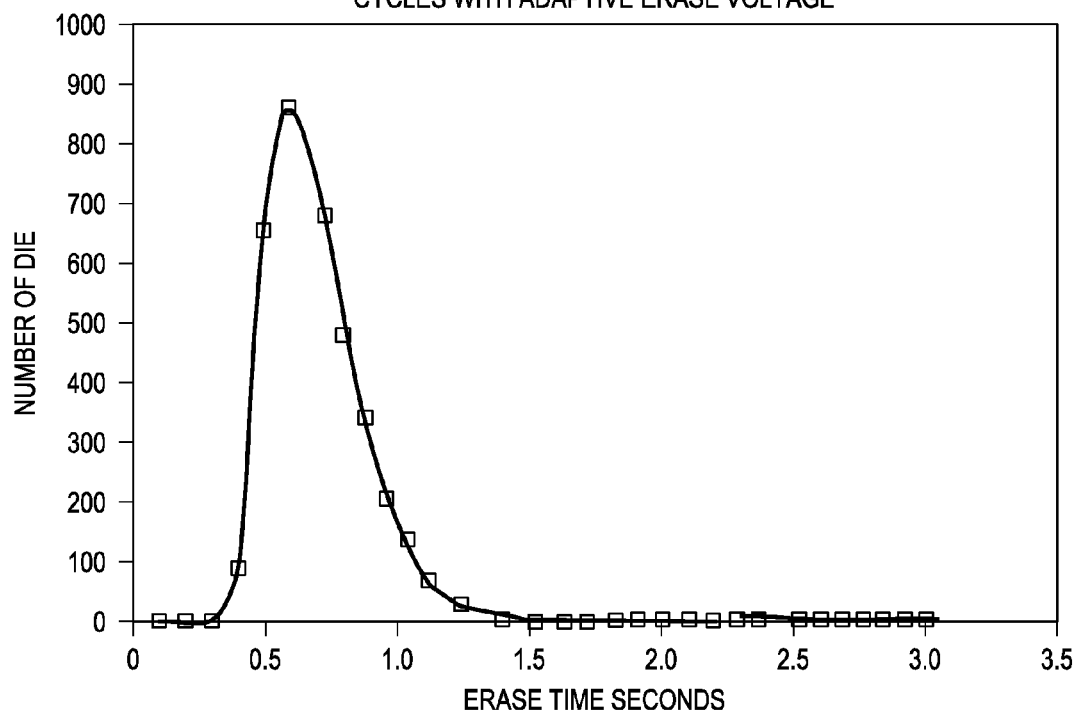

FIG. 9A through 9C shows a distribution of block erase times using the adaptive erase voltage method described in FIG. 8. FIG. 9A shows the distribution of block erase times after one erase/write cycle. FIG. 9B shows the distribution of block erase times after 500 erase/write cycles. The erase time of a significant number of the memory blocks has increased to over 1 second. FIG. 9C shows the distribution of block erase times after 501 erase/cycles and after updated adaptive erase voltages are applied, in accordance with the method of FIG. 8.

Figure 10:
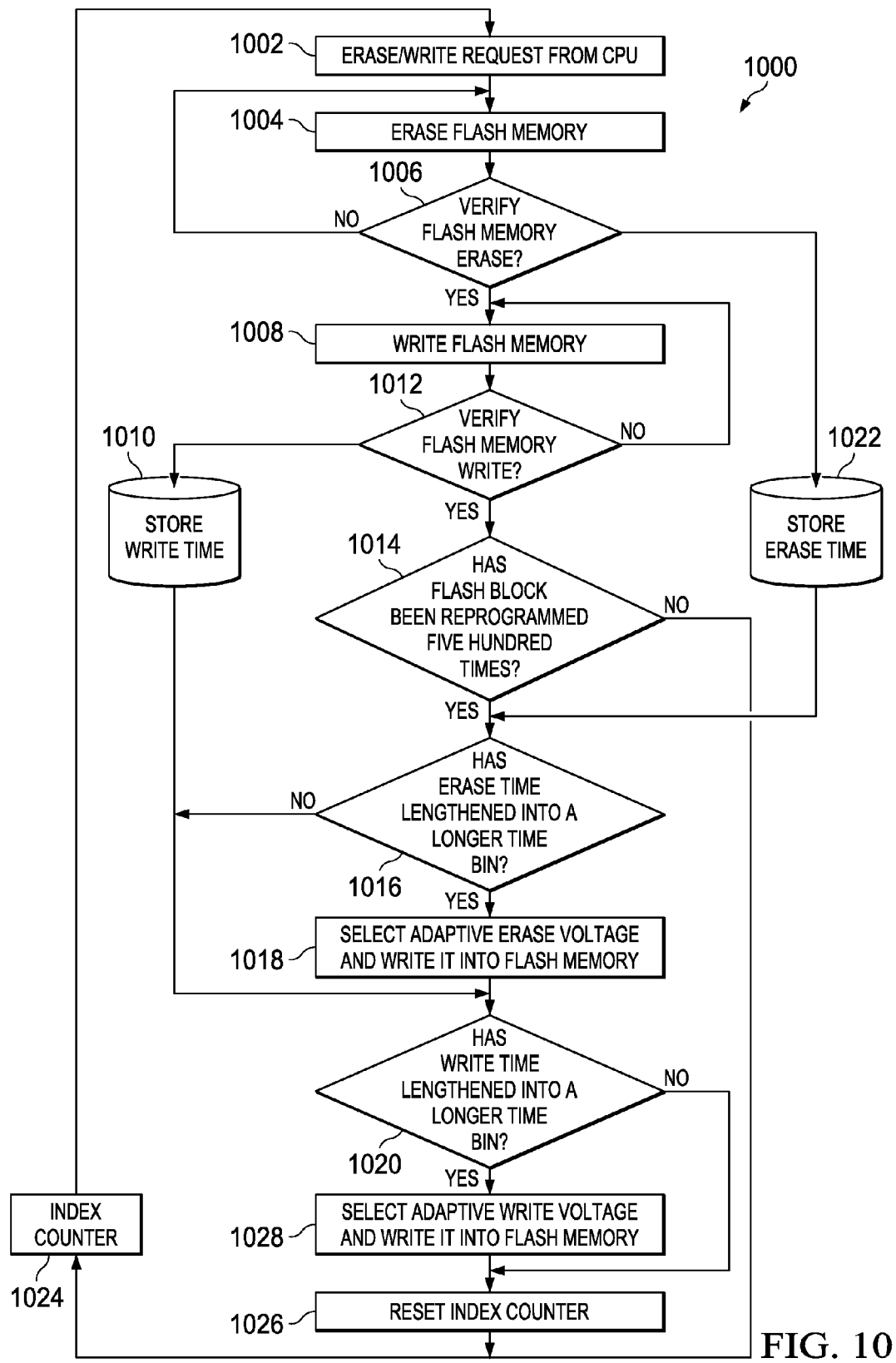
FIG. 10 is a flow diagram describing another embodiment for adaptive programming over the lifetime of a flash circuit.

FIG. 10 is a flow diagram 1000 of a write operation and an erase operation in a flash memory. Again for illustration, 500 erase/write cycles are completed (a different cut-off number could have been selected) before checking whether the erase or write program times have lengthened to the extent that a new adaptive erase voltage or adaptive write voltage is required. Because all of the flash bits in a memory sector 110 or memory block 108 are simultaneously erased, only one adaptive erase voltage is typically saved for that sector or block. Alternatively, because words or rows are typically written individually, several adaptive write voltages may be saved if there are several slow-to-write words or rows in a memory sector or memory block. For example, individual adaptive write voltages may be saved for each memory sector in a memory block or for several words or rows in a memory sector. Alternatively, one adaptive write voltage may be saved for multiple slow rows in a memory sector or memory block.

An example embodiment using both adaptive write voltage and adaptive erase voltages is illustrated in FIG. 10. The operation starts in step 1002 when the CPU 102 sends an erase/write request to the API 104 that in turn sends the appropriate signals to the flash memory 106 to perform the requested task. The requested memory sector 110 or memory block 108 is erased in step 1004 and the erase is verified in step 1006. If the erase is not verified then the program may return to step 1004 for an additional erase cycle. The erase time for the last erase/write cycle is stored in step 1022. After a flash bit has undergone a number of erase/write cycles, charge may become trapped in the tunnel oxide causing the erase time to lengthen.

After the erase is verified in step 1006, the data is written into the memory block in step 1008. The data may be written into the flash memory either one word or one memory row at a time. The write time may be stored 1010 by word or by memory row for each word or memory row in the memory block. If the write operation of a word or memory row is not verified in step 1012 then the API program may return to step 1008 to repeat the write operation until it is successfully verified in step 1012.

After the entire memory block is successfully erased and written, the index counter 1024 may be checked in step 1014 to determine if it has been written 500 times since the last adaptive programming voltage update. If not, the index counter 1024 is incremented and the API 104 waits for the next erase/write request. If, however, 500 write cycles have been performed since the last adaptive programming voltage update, the erase time from step 1022 is checked in step 1016 to see if the erase time has lengthened to the point where a new adaptive erase voltage is required. If a new adaptive erase voltage for the memory block is needed, then the new adaptive erase voltage is selected and written into flash memory in step 1018 to be used in subsequent erase cycles. The new adaptive erase voltage may be selected from a table similar to Table 1 or calculated using an algorithm that has been calibrated using adaptive erase data.

The write time 1010 for each word or memory row may be checked 1020 to determine if any have lengthened to the point where a new adaptive write voltage is required. If one or more have, new adaptive write voltages are selected and written into memory in step 1028 to be used to write those words or memory rows in subsequent write cycles. The new adaptive write voltage may be selected from a table similar to Table 1 that is prepared for write adaptive voltages or may be calculated using an algorithm that has been calibrated using adaptive write voltage data. The counter is then reset to zero in step 1026 to begin the next set of 500 erase/write cycles.

The number of erase/write cycles between each adaptive programming voltage update, block erase, and word or memory row write, that are discussed supra are for illustrative purposes only. Other numbers of erase/write cycles, other numbers of erased bits per cycle, and other numbers of written bits or bytes per cycle may also be used. In the embodiment described in FIG. 10, the erase time check 1016 and update 1018 steps are performed before the write time check 1020 and update 1028 steps are performed; but steps 1020 and 1028 may be performed before steps 1016 and 1018 if desired.

Figure 11A:
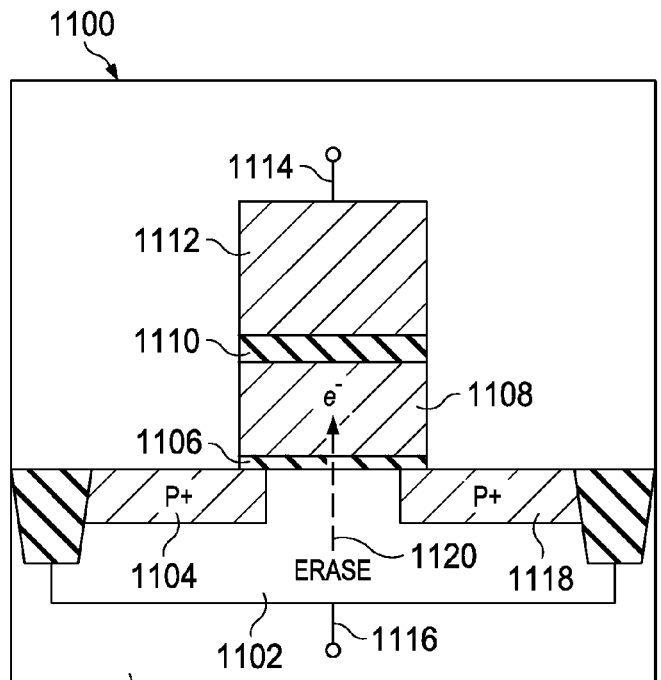
FIGS. 11A and 11B are cross-sections of a PMOS flash bit during an erase and a write operation.
Figure 11B:
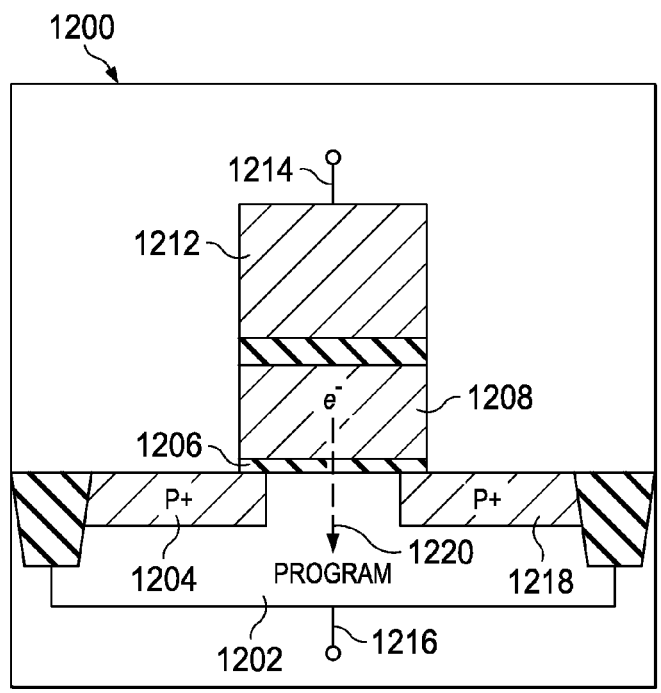

Although an NMOS flash memory is used to illustrate the above embodiments, a PMOS flash memory such as is described in FIGS. 11A and 11B may instead be used. A PMOS flash bit 1100 may be formed in an nwell 1102 that is formed in a p-type substrate 1101. During an erase operation, a high voltage 1114 (i.e. about 17V) may be applied to the control gate 1112 which is capacitively coupled to the floating gate 1108 through the interpoly dielectric 1110. The source 1104 and drain 1118 may be floated during the erase operation. The high voltage 1114 on the control gate 1112 raises the potential on the floating gate 1108; encouraging electrons to tunnel through the gate dielectric 1106 and causing the voltage on the floating gate 1108 to become approximately neutral. During a read operation the voltage 1114 on the control gate 1112 of the PMOS flash bit is changed from Vdd to ground, causing the PMOS flash transistor to turn on, thereby indicating an erased state.

As shown in FIG. 11B, the PMOS flash bit 1200 may be programmed by applying a negative voltage 1214 (i.e. about −8.5V) to the control gate 1212 and a positive voltage 1216 (i.e. about +8.5V) to the nwell 1202. The source 1204 and drain 1218 may be floated during the program operation. The negative voltage 1214 on the control gate 1212, in combination with the positive voltage 1216 on the nwell 1202, causes electrons to tunnel off the floating gate 1208 and into the nwell 1202 through the gate dielectric 1206. This leaves a residual positive voltage on the floating gate 1208. During a read operation, the voltage 1214 on the control gate 1212 of the PMOS flash bit 1200 is changed from Vdd to zero. The residual positive charge on the floating gate 1208 prevents the PMOS flash transistor from turning on, thereby indicating a programmed state.

While various embodiments have been described above, it should be understood that they have been presented by way of example only and not limitation. Numerous changes to the disclosed embodiments can be made in accordance with the disclosure herein without departing from the spirit or scope of the embodiments. Thus, the breadth and scope of the embodiments should not be limited by any of the above-described embodiments. Rather, the scope of the embodiments should be defined in accordance with the following claims and their equivalents.

What is claimed is:

1. A method for programming a flash memory comprising:
   determining a time to program a portion of said flash memory at a programming voltage;
   determining an adaptive programming voltage based upon said time to program said portion of said flash memory at said programming voltage, said adaptive programming voltage being a well voltage; and
   using said adaptive programming voltage for future programming of said portion of said flash memory.

2. The method of claim 1 wherein said programming is an erase operation.

3. The method of claim 1 wherein said programming is a write operation.

4. The method of claim 1 wherein said programming is an erase operation plus a write operation.

5. The method of claim 1 wherein said adaptive programming voltage is a control gate voltage.

6. The method of claim 1 wherein said portion of said flash memory is a memory block, a memory sector, or all bits in said flash memory.

7. The method of claim 1 where said adaptive programming voltage is a control gate voltage plus said well voltage.

8. A method of programming a flash circuit, comprising:
   indexing a counter after each erase/write cycle is performed on a portion of a flash memory in said flash circuit;
   checking a programming time after said counter reaches a predetermined number of erase/write cycles;
   when said counter reaches said predetermined number of erase/write cycles and said programming time exceeds a programming time specification, selecting a new adaptive programming voltage, then writing said new adaptive programming voltage into said flash memory, and using said new adaptive programming voltage for future programming of said portion of said flash memory; and
   resetting said counter after reaching said predetermined number of erase/write cycles.

9. The method of claim 8 wherein said programming is to erase said flash memory in said flash circuit.

10. The method of claim 8 wherein said programming is to write to said flash memory in said flash circuit.

11. The method of claim 8 wherein said programming is an erase plus a write to said flash memory in said flash circuit.

12. The method of claim 8 wherein said adaptive programming voltage is a control gate voltage.

13. The method of claim 8 wherein said adaptive programming voltage is a well voltage.

14. The method of claim 8 wherein said portion of said flash memory is a memory block, a memory sector, or all bits in said flash memory.

15. The method of claim 8 where said adaptive programming voltage is a control gate voltage plus a well voltage.

16. A method of programming a flash circuit, comprising:
   indexing a counter after each erase/write cycle is performed on a portion of a flash memory in said flash circuit using a programming voltage;
   checking an erase time after said counter reaches a predetermined number of erase/write cycles;
   when said erase time exceeds an erase time specification, selecting an adaptive erase voltage, then writing said adaptive erase voltage into said flash memory, and using said adaptive erase voltage for a future erase operation of said portion of said flash memory;
   checking a write time after said counter reaches said predetermined number of erase/write cycles;
   when said write time exceeds a write time specification, selecting an adaptive write voltage, then writing said adaptive write voltage into said flash memory, and using said adaptive write voltage for a future write operation of said portion of said flash memory; and
   resetting said counter after reaching said predetermined number of erase/write cycles.

17. The method of claim 16 where said adaptive erase voltage is a flash gate voltage and where said adaptive write voltage is a flash gate voltage.

18. The method of claim 16 where said adaptive erase voltage is a flash well voltage and where said adaptive write voltage is a flash well voltage.

19. The method of claim 16 where said adaptive erase voltage is a flash gate voltage plus a flash well voltage, and where said adaptive write voltage is a flash gate voltage plus a flash well voltage.

* * * * *